(12) United States Patent
Kare et al.

(10) Patent No.: US 11,681,071 B2
(45) Date of Patent: *Jun. 20, 2023

(54) DIFFUSION SAFETY SYSTEM

(71) Applicant: LaserMotive, Inc., Kent, WA (US)

(72) Inventors: Jordin T. Kare, San Jose, CA (US); Thomas J. Nugent, Jr., Bellevue, WA (US); David Bashford, Kent, WA (US)

(*) Notice: Subject to any disclaimer, the term of this patent is extended or adjusted under 35 U.S.C. 154(b) by 0 days.

This patent is subject to a terminal disclaimer.

(21) Appl. No.: 17/404,952

(22) Filed: Aug. 17, 2021

(65) Prior Publication Data

US 2021/0373196 A1 Dec. 2, 2021

Related U.S. Application Data

(62) Division of application No. 15/574,659, filed as application No. PCT/US2016/033120 on May 18, 2016, now Pat. No. 11,105,954.

(Continued)

(51) Int. Cl.
*G01V 8/22* (2006.01)
*G01S 17/87* (2020.01)
(Continued)

(52) U.S. Cl.
CPC ............... *G01V 8/22* (2013.01); *G01S 7/003* (2013.01); *G01S 7/006* (2013.01); *G01S 7/484* (2013.01);
(Continued)

(58) Field of Classification Search
CPC ... G01V 8/22; G01V 8/26; G01V 8/20; G01V 8/18; G01V 8/14; G01V 8/12; G01V 8/10; H02J 50/30; H02J 50/60; H02J 50/20; H02J 17/00; H02J 50/90; H02J 50/10; G01S 17/04; G01S 7/003; G01S 7/006; G01S 7/484; G01S 7/486; G01S 17/06; G01S 17/87; G01S 17/88; G01S 17/89; G01S 17/023; G01S 13/862; G01S 13/865; G01S 13/867; H01S 5/005; H01S 5/0085; H01S 5/06216; H01S 5/423; H04B 10/1141; H04B 10/807; F41H 13/005

See application file for complete search history.

(56) References Cited

U.S. PATENT DOCUMENTS 5,004,908 A * 4/1991 Nakamura ............... G01V 8/12
250/221
5,008,529 A * 4/1991 Nakamura ............... G01V 8/10
250/221

(Continued)

*Primary Examiner* — John R Lee

(57) ABSTRACT

A power beaming system includes a power beam transmitter arranged to transmit the power beam, and a power beam receiver arranged to receive the power beam from the power beam transmitter. A power beam transmission source is arranged to generate a laser light beam for transmission by the power beam transmitter from a first location toward a remote second location. A beam-shaping element shapes the laser light beam, at least one diffusion element uniformly distributes light of the shaped laser light beam, and a projection element illuminates a power beam receiving element of predetermined shape with the shaped laser light beam. At the power beam receiver, a diffusion surface diffuses a portion the power beam specularly reflected from the power beam receiver.

20 Claims, 6 Drawing Sheets

Related U.S. Application Data

(60) Provisional application No. 62/163,307, filed on May 18, 2015.

(51) Int. Cl.

| | |
|---|---|
| *G01S 7/00* | (2006.01) |
| *H02J 50/30* | (2016.01) |
| *H04B 10/80* | (2013.01) |
| *H01S 5/00* | (2006.01) |
| *G01S 17/88* | (2006.01) |
| *G01S 7/484* | (2006.01) |
| *G01S 17/04* | (2020.01) |
| *G01S 17/89* | (2020.01) |
| *G01S 17/06* | (2006.01) |
| *H01S 5/062* | (2006.01) |
| *H01S 5/42* | (2006.01) |
| *H02J 50/60* | (2016.01) |
| *H02J 50/10* | (2016.01) |
| *H02J 50/90* | (2016.01) |
| *H04B 10/11* | (2013.01) |
| *H04B 10/114* | (2013.01) |

(52) U.S. Cl.
CPC ............. *G01S 17/04* (2020.01); *G01S 17/06* (2013.01); *G01S 17/87* (2013.01); *G01S 17/88* (2013.01); *G01S 17/89* (2013.01); *H01S 5/005* (2013.01); *H01S 5/0085* (2013.01); *H01S 5/06216* (2013.01); *H01S 5/423* (2013.01); *H02J 50/10* (2016.02); *H02J 50/30* (2016.02); *H02J 50/60* (2016.02); *H02J 50/90* (2016.02); *H04B 10/1141* (2013.01); *H04B 10/807* (2013.01)

(56) References Cited

U.S. PATENT DOCUMENTS

| | | | | |
|---|---|---|---|---|
| 5,019,768 A * | 5/1991 | Criswell | ............. | H01Q 1/248 343/912 |
| 5,386,105 A * | 1/1995 | Quinn | ............. | G06K 7/10811 235/462.35 |
| 5,631,721 A * | 5/1997 | Stanton | ............. | G03F 7/70158 355/71 |
| 6,259,561 B1 * | 7/2001 | George | ............. | G02B 27/425 359/569 |
| 6,534,705 B2 * | 3/2003 | Berrios | ............. | F03H 3/00 323/221 |
| 6,777,684 B1 * | 8/2004 | Volkov | ............. | G01N 21/3581 343/915 |
| 6,956,992 B2 * | 10/2005 | Coleman | ............. | G02B 6/4206 385/33 |
| 9,014,553 B2 * | 4/2015 | Weichert | ............. | H04B 10/071 398/16 |
| 9,312,701 B1 * | 4/2016 | Mor | ............. | H02J 50/30 |
| 10,488,549 B2 * | 11/2019 | Kare | ............. | H02J 50/90 |
| 11,105,954 B2 * | 8/2021 | Kare | ............. | H01S 5/005 |
| 2002/0046763 A1 * | 4/2002 | Berrios | ............. | H02J 50/40 136/244 |
| 2003/0075670 A1 * | 4/2003 | Tuominen | ............. | H02J 50/30 250/205 |
| 2004/0156400 A1 * | 8/2004 | Caplan | ............. | H02J 50/90 372/5 |
| 2004/0266367 A1 * | 12/2004 | Tuominen | ............. | H04B 10/807 455/91 |
| 2006/0202115 A1 * | 9/2006 | Lizotte | ............. | B23K 26/04 250/234 |
| 2007/0001822 A1 * | 1/2007 | Haug | ............. | G06V 10/145 340/384.1 |
| 2007/0019693 A1 * | 1/2007 | Graham | ............. | H02J 50/30 372/38.09 |
| 2007/0217795 A1 * | 9/2007 | Otte | ............. | H04B 10/112 398/131 |
| 2007/0292141 A1 * | 12/2007 | Kim | ............. | H04B 10/1149 398/182 |
| 2008/0130124 A1 * | 6/2008 | Graham | ............. | H02J 5/00 359/614 |
| 2008/0291140 A1 * | 11/2008 | Kent | ............. | G03B 33/08 313/503 |
| 2008/0310852 A1 * | 12/2008 | Tan | ............. | H04B 10/803 398/136 |
| 2009/0103925 A1 * | 4/2009 | Alpert | ............. | H04B 10/807 398/130 |
| 2010/0012819 A1 * | 1/2010 | Graham | ............. | H04B 10/807 250/237 R |
| 2010/0142021 A1 * | 6/2010 | Malyak | ............. | G02B 26/101 359/201.1 |
| 2011/0109907 A1 * | 5/2011 | Meyers | ............. | G01N 21/648 356/445 |
| 2012/0189312 A1 * | 7/2012 | Maryfield | ............. | H04B 10/1143 398/118 |
| 2012/0314410 A1 * | 12/2012 | Leard | ............. | G01N 21/255 362/257 |
| 2014/0085695 A1 * | 3/2014 | Borchers | ............. | G02B 26/101 359/201.2 |
| 2014/0168734 A1 * | 6/2014 | Dell'Eva | ............. | G03H 1/0402 359/30 |
| 2014/0307307 A1 * | 10/2014 | Georgiou | ............. | G01B 11/2545 359/558 |
| 2015/0124433 A1 * | 5/2015 | Onishi | ............. | H01S 5/0087 362/84 |
| 2015/0168749 A1 * | 6/2015 | Heinemann | ............. | G02B 26/124 359/285 |
| 2016/0258599 A1 * | 9/2016 | Genthon | ............. | F21V 14/003 |
| 2016/0294472 A1 * | 10/2016 | Palmer | ............. | H04B 7/0617 |
| 2018/0136335 A1 * | 5/2018 | Kare | ............. | G01V 8/22 |
| 2018/0136364 A1 * | 5/2018 | Kare | ............. | G01V 8/22 |
| 2021/0373196 A1 * | 12/2021 | Kare | ............. | H04B 10/807 |

* cited by examiner

DIFFUSION SAFETY SYSTEM

CROSS-REFERENCE TO RELATED APPLICATIONS

This application is a continuation of U.S. patent application Ser. No. 15/574,659, filed Nov. 16, 2017, entitled "Diffusion Safety System," which was a national phase filing of International Application No. PCT/US16/33120, filed May 18, 2016, entitled "Diffusion Safety System," which claimed the benefit under 35 U.S.C. § 119(e) of U.S. Provisional Patent Application No. 62/163,307, filed on May 18, 2015, entitled "Provisional Patents for Wireless Power." Each of these related applications is hereby incorporated by reference in its entirety to the extent not inconsistent herewith.

BACKGROUND

Technical Field

The present disclosure generally relates to light diffusion in or around a hazardous area. More particularly, but not exclusively, the present disclosure relates to diffusion of light from a high-flux power beam or field.

Description of the Related Art

One form of remote power, which may also be referred to here as wireless power, beamed power, or wirelessly beamed power, is a laser power beaming system. A laser power beaming system, also called an optical wireless power system, includes at least one transmitter and at least one receiver. In a conventional laser power beaming system, the transmitter forms a high-flux beam of laser light, which is projected through the air over a distance toward the receiver. The receiver, which may be in a remote area having an absence of easily available power, includes a photovoltaic array to receive the high-flux beam of laser light. At the receiver, the laser light is converted to usable electric power, which is transported to one or more circuits where the power is consumed.

In conventional laser power beaming systems, the transmitter includes a laser assembly, which converts electric power into optical power (i.e., light), typically but not necessarily in the near-infrared (NIR) portion of the optical spectrum wavelength between 0.7 and 2.0 µm. The laser assembly is generally formed from a single laser or multiple lasers, which may be mutually coherent or incoherent. In some cases, the one or more lasers may be replaced by one or more light emitting diodes (LEDs), super-radiant diodes, or some other high-intensity light source. The light high-flux output of the laser assembly passes through various optical elements (e.g., optical fibers, lenses, mirrors, etc.) which convert the raw laser light to a beam of a desired size, shape, power distribution, and divergence. Various elements of the laser assembly also aim the light high-flux beam toward the receiver.

After leaving the transmitter, the high-flux light beam travels through free space toward the receiver. At the receiver, the high-flux optical beam impinges the photovoltaic array. Power from the high-flux optical beam is captured, either directly or via collecting optics such as lenses or mirrors, and converted at least partly back to another form of useful power. In most cases, photovoltaic array converts light to direct current (DC) electricity. In other cases, however, the light may be converted to electricity in other ways, for example by converting the optical power to heat, which drives a heat engine (e.g., Stirling engine, turbine), a thermoelectric device, or some other device.

All of the subject matter discussed in the Background section is not necessarily prior art and should not be assumed to be prior art merely as a result of its discussion in the Background section. Along these lines, any recognition of problems in the prior art discussed in the Background section or associated with such subject matter should not be treated as prior art unless expressly stated to be prior art. Instead, the discussion of any subject matter in the Background section should be treated as part of the inventor's approach to the particular problem, which in and of itself may also be inventive.

BRIEF SUMMARY

The problem of inefficiency of a laser light source and "hot spots" formed within a high-flux light beam are solved with a diffusion element that efficiently distributes laser light flux across a projection lens. The problem of high power laser light dangerously reflected from a receiving module is solved by a diffusion element that safely distributes, scatters, or otherwise disperses the reflected laser light across a wider area.

In some embodiments of the inventive concepts described herein, a first diffusion element is arranged in a system that generates and transmits a high-flux light beam. The diffusion element uniformly distributes light across a projection element in a way that cooperates with other optical elements to produce a power beam having a size and shape that match an illuminated reception element. The uniform distribution of light reduces the incidence of "hot spots," which improves safety to humans, animals, and other objects. This uniform distribution also aids in converting the laser source from a point source to an extended source. Alternatively, or in addition, some embodiments of the inventive concepts described herein include a second diffusion element arranged in a system that receives a high-flux light beam. The second diffusion element is arranged and positioned to capture and diffuse portions of the high-flux light beam reflected from the unit that receives high-flux light beam.

In a first case, a system to diffuse a power beam includes a power beam transmitter arranged to transmit the power beam, a power beam receiver arranged to receive the power beam from the power beam transmitter, and a diffusion surface arranged to diffuse a portion of the power beam specularly reflected from the power beam receiver.

In some embodiments of the first case, the power beam receiver includes at least one photovoltaic arrangement having at least one surface positioned in a line of sight of the power beam. Here, the diffusion surface is positioned in proximity to the at least one photovoltaic arrangement. The diffusion surface is a diffuser attached at the surface of the at least one photovoltaic arrangement in some embodiments. The diffusion surface is arranged to diffuse specularly reflected light from at least one of the diffusion surface, the at least one photovoltaic arrangement, and a protective material positioned above the at least one photovoltaic arrangement in some embodiments. Alternatively, the diffusion surface is deposited on the at least one photovoltaic arrangement.

In some cases, the power beam receiver includes a transparent covering positioned above the at least one photovoltaic arrangement, and the diffusion surface is positioned on a back surface of the transparent covering. Sometimes, the transparent covering has a front surface bearing an antireflective coating, which is selected based on a wavelength of the power beam, and sometimes, the transparent covering has a diffusion feature integrated therein.

In some further embodiments of the first case, the diffusion surface includes a plurality of lenslets, one or more diffractive optical elements (DOEs) formed as at least one sheet of polymers applied to a glass substrate, one or more diffractive optical elements (DOEs) etched directly into glass, or alternatively or in addition, one or more micro-lens arrays (MLAs).

In a second case, a power beaming system includes a power beam transmission source arranged to generate a laser light beam for transmission from a first location toward a second location. The first and second locations are remote from each other. The power beaming system also includes a beam-shaping element to shape the laser light beam, at least one diffusion element to uniformly distribute flux of the shaped laser light beam, and a projection element arranged to illuminate a power beam receiving element of predetermined shape with the shaped laser light beam.

In some embodiments of the second case, the power beam transmission source includes at least one of a laser diode, a gas laser, or a fiber laser, and the laser light beam has a determined divergence, which is different in vertical and horizontal directions. The beam-shaping element may include at least one anamorphic prism or at least one cylindrical lens, or the beam-shaping element may include at least one non-spherical lens arranged to form a uniform circular beam, square beam, or rectangular beam from a non-uniform beam. Several features associated with at least one diffusion element are contemplated in the second case. For example, in some embodiments of the second case, at least one diffusion element is arranged to increase an apparent angular size (AAS) of the shaped laser light beam. In some embodiments, the at least one diffusion element is arranged to produce a geometrically symmetric distribution of the shaped laser light beam. In still other embodiments, the at least one diffusion element includes an internally-reflective tube or an arrangement of microlenses.

In some embodiments of the second case, a condenser lens is positioned to direct central rays of light from the at least one diffusion element toward a central portion of the projection element. In some embodiments of the second case, an optical relay element may be positioned to reduce an intensity of light reaching the at least one diffusion element. A field lens may also be positioned between the optical relay element and the at least one diffusion element. In some embodiments of the second case, an optical relay element is positioned to enlarge a beam of light and to reduce angular divergence of the beam of light by a corresponding factor. For example, an optical relay element in some embodiments is positioned to enlarge a beam of light by at least 50 percent and to reduce angular divergence of the beam of light by a corresponding factor. In still other embodiments, an optical relay element is positioned to enlarge a beam of light by at least 300 percent and to reduce angular divergence of the beam of light by a corresponding factor. Sometimes, an optical relay element is positioned to enlarge a beam of light and to reduce angular divergence of the beam of light by a corresponding factor, and a field lens is sometimes integrated with the diffusion element.

In still other embodiments of the second case, the projection element is at least one of a zoom lens and a varifocal lens. The zoom lens or the varifocal lens, whichever the case may be, is selectably positionable to match the shaped laser light beam to a size and shape of the power beaming receiving element over a range of power beaming receiving element sizes and distances from the first location. In some embodiments, an angular distribution of light from the diffusion element is manually selectable to substantially fill a projection element aperture for a range of projection element focal lengths, and in other embodiments, the angular distribution of light from the diffusion element is automatically selectable.

In some embodiments, a beam width and a light distribution of the shaped laser light is matched to a projection element aperture by varying a position of the diffusion element. In other embodiments, a beam width and a light distribution of the shaped laser light are matched to a projection element aperture by varying divergence of the shaped laser light entering an internally-reflective homogenizer. The power beam transmission source includes a plurality of power beam transmission sources arranged to provide a plurality of parallel laser light beams in some embodiments, and herein, the projection element may include a plurality of projection elements positioned slightly off-axis relative to each other, so that respective light beams passed from each of the plurality of projection elements are arranged to converge on the power beam receiving element. The plurality of projection elements may include one or more field lenses.

In some embodiments of the second case, the projection element includes a plurality of projection lenses closely packed and aligned to increase an effective apparent angular size (AAS). In other embodiments, however, the projection element includes a plurality of projection lenses spaced apart and aligned to increase an effective apparent angular size (AAS).

In a third case, a method of power beam diffusion includes generating a laser light beam, wherein the laser light beam is a high-flux laser light beam. The method also includes passing the laser light beam through a beam-shaping element to form a shaped laser light beam, uniformly distributing flux of the shaped laser light beam with a first diffusing element, passing the shaped laser light beam having the uniformly distributing flux to a projecting element as a high-flux light beam, and projecting the high-flux light beam toward a light-based receiver. At the light-based receiver, the method includes receiving at least a portion of the high-flux light beam with a receiver optics and control module, and diffusing, with a second diffusing element, at least some light reflected from the receiver optics and control module.

In some embodiments of the third case, the beam shaping element and the projection element cooperate to illuminate a power beam receiving element of the receiver optics and control module with the high-flux light beam. In these embodiments, the high-flux light beam is formed having a predetermined shape and the power beam receiving element also has the predetermined shape. In some embodiments, uniformly distributing flux of the shaped laser light beam includes increasing an apparent angular size (AAS) of the shaped laser light beam, and in other cases, uniformly distributing flux of the shaped laser light beam includes producing a geometrically symmetric distribution of the shaped laser light beam.

In some embodiments of the third case, the method includes reducing, with an optical relay element, an intensity of light reaching the at least one diffusion element. In some embodiments of the third case, the method includes enlarging, with an optical relay element, the shaped laser light beam by at least 50 percent and reducing angular divergence of the shaped laser light beam by a factor corresponding to the enlarging. Alternatively, the optical relay element may be used in the method to enlarge the shaped laser light beam by at least 300% while angular divergence of the shaped laser light beam is reduced by a factor corresponding to the enlarging.

In some embodiments of the third case, projecting the high-flux light beam toward a light-based receiver includes selectably positioning a zoom lens or a varifocal lens to match the shaped laser light beam having the uniformly distributing flux to a size and shape of a power beam receiving element of the receiver optics and control module. In these embodiments, selectably positioning the zoom lens or the varifocal lens may include manually or automatically positioning the zoom lens or the varifocal lens to substantially fill a projection element aperture. In some embodiments, projecting the high-flux light beam toward a light-based receiver includes varying a position of the diffusion element. Sometimes, in embodiments of the third case, generating the laser light beam includes generating a plurality of parallel high-flux laser light beams. In addition, or in the alternative, projecting the high-flux light beam toward the light-based receiver may include aligning the plurality of parallel high-flux laser light beams slightly off-axis relative to each other to converge the projected high-flux light beam on a power beam receiving element of the receiver optics and control module.

This Brief Summary has been provided to introduce certain concepts in a simplified form that are further described in detail below in the Detailed Description. Except where otherwise expressly stated, the summary is not intended to identify key or essential features of the claimed subject matter, nor is it intended to limit the scope of the claimed subject matter.

BRIEF DESCRIPTION OF THE SEVERAL VIEWS OF THE DRAWINGS

Non-limiting and non-exhaustive embodiments are described with reference to the following drawings, wherein like labels refer to like parts throughout the various views unless otherwise specified. The sizes and relative positions of elements in the drawings are not necessarily drawn to scale. For example, the shapes of various elements are selected, enlarged, and positioned to improve drawing legibility. The particular shapes of the elements as drawn have been selected for ease of recognition in the drawings. One or more embodiments are described hereinafter with reference to the accompanying drawings in which.

DETAILED DESCRIPTION

Figure 1:
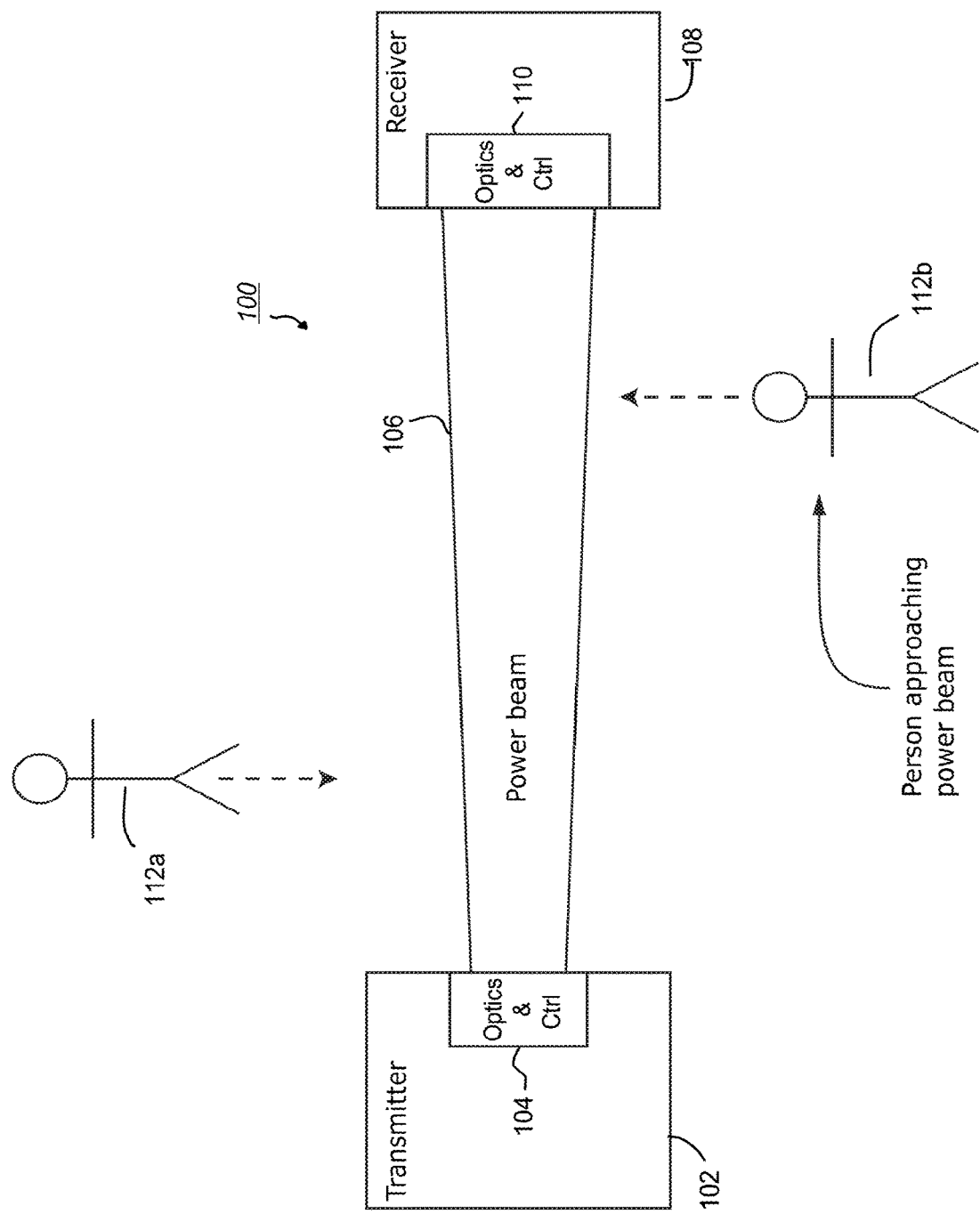
FIG. 1 is a power beaming system having one or more diffusion elements that increase efficiency and provide improved safety.

The present application is related to the following applications filed on the same day as the present application, naming the same inventors, and assigned to the same entity; each of said applications incorporated herein by reference to the fullest extent allowed by law: U.S. patent application Ser. No. 15/574,655, entitled MULTI-LAYERED SAFETY SYSTEM, bearing client number 720173.405; U.S. patent application Ser. No. 15/574,657, entitled LIGHT CURTAIN SAFETY SYSTEM, bearing client number 720173.406; U.S. patent application Ser. No. 15/574,667, entitled LOCATING POWER RECEIVERS, bearing client number 720173.409; U.S. patent application Ser. No. 15/574,668, entitled MULTISTAGE WIRELESS POWER, bearing client number 720173.410.

In the following description, certain specific details are set forth in order to provide a thorough understanding of various disclosed embodiments. However, one skilled in the relevant art will recognize that embodiments may be practiced without one or more of these specific details, or with other methods, components, materials, etc. In other instances, well-known structures associated with power beaming systems have not been shown or described in detail to avoid unnecessarily obscuring descriptions of the embodiments.

Prior to setting forth the embodiments however, it may be helpful to an understanding thereof to first set forth definitions of certain terms that are used hereinafter.

The term, "free space," as it is used in the present disclosure, means any reasonably transparent medium such as air or vacuum, water, gas, and the like. Free space is distinguished from a mechanical medium such as an optical fiber or conduit that confines or encloses a high-flux light beam or field. Within the present disclosure, a free space path may include one or more mirrors, lenses, prisms, or other discrete optical elements that redirect or alter particular characteristics of a high-flux light beam.

The term power beam is used, in all its grammatical forms, throughout the present disclosure and claims to refer to a high-flux light transmission that may include a field of light, that may be generally directional, that may be arranged for steering/aiming to a suitable receiver. The power beams discussed in the present disclosure include beams formed by high-flux laser diodes or other like sources sufficient to deliver a desirable level of power to a remote receiver without passing the power over a conventional electrical conduit such as wire.

In the present disclosure, the term "light," when used as part of a light-based transmitter or a light-based receiver, refers to a transmitter or receiver arranged to produce or capture, as the case may be, electromagnetic radiation that falls within the range of frequencies that can be directed (e.g., reflected, refracted, filtered, absorbed, captured, and the like) by optical or quasi-optical elements, and which is defined in the electromagnetic spectrum spanning from extremely low frequencies (ELF) through gamma rays, and which includes at least ultraviolet light, visible light, long-, mid- and short-wavelength infrared light, terahertz radiation, millimeter waves, microwaves, and other visible and invisible light.

As used in the present disclosure, the terms, "specular reflection," "specularly reflected," and other terms that discuss such reflections refer to light that reflects from surfaces that are completely specular and close to completely specular, allowing for imperfections in the reflective surface, curvature of the reflective surface, or other such features. The identified specular reflections are distinguished from diffuse reflections, such as Lambertian diffusive reflections, which spread the beam out across a much wider angle. In the context of the present disclosure, a specular reflection of a high-flux power beam is one in which the reflected light remains insufficiently diffused and thereby not safe to the eye, skin, or other biological tissue of human beings or animals.

The present invention may be understood more readily by reference to the following detailed description of the preferred embodiments of the invention. It is to be understood that the terminology used herein is for the purpose of describing specific embodiments only and is not intended to be limiting. It is further to be understood that unless specifically defined herein, the terminology used herein is to be given its traditional meaning as known in the relevant art.

FIG. 1 is a power beaming system 100 having one or more diffusion elements that increase efficiency and provide improved safety. In the power beaming system 100, a laser-based transmitter 102 converts electric power into optical power (i.e., light). The laser-based transmitter 102 may operate in the near-infrared (NIR) portion of the optical spectrum wavelength, such as between 0.7 and 2.0 µm, though flux in a different part of the electromagnetic spectrum may also be used. The laser-based transmitter 102 can be formed from a single laser or multiple lasers, which may be mutually coherent or incoherent. In some cases, the one or more lasers may be replaced by one or more light emitting diodes (LEDs), superradiant diodes, or some other high-intensity light source.

A transmitter optics and control module 104 directs operations of the laser-based transmitter 102. The transmitter optics and control module 104 includes optical structures such as optical fibers, lenses, mirrors, and various other optical elements that convert raw laser light to a high-flux light beam of a desired size, shape, power distribution, and divergence. Various other elements of the transmitter optics and control module 104 aim the high-flux light beam in a desired direction. Certain electronic, mechanical, and/or electromechanical structures of the transmitter optics and control module 104 direct the operations of the laser-based transmitter 102.

A high-flux light beam 106 produced by the laser-based transmitter 102 is transmitted through free space from a first location, where the laser-based transmitter 102 is positioned, toward a second location, where a laser-based receiver 108 is positioned. At the laser-based receiver 108, the high-flux light beam 106 strikes a receiver optics and control module 110. The receiver optics and control module 110 may include certain collecting optics such as lenses or mirrors, certain protective coverings, a power conversion means such as a photovoltaic array, and one or more safety mechanisms such as a diffusion element. The power conversion means (e.g., photovoltaic array, Stirling engine, or some other opto-electric or thermoelectric device) converts at least some portion of the received high-flux light beam 106 into electricity under the control and direction of the receiver optics and control module 110.

A first human being 112a and a second human being 112b are present in FIG. 1. The human beings are shown as moving toward or otherwise in proximity to the high-flux light beam 106.

It has been recognized by the present inventors that specular reflections of laser light can in some cases be hazardous. The dangers of high-flux laser light are addressed in various U.S. and international standards. For example, in ANSI Z136.1, a laser eye exposure hazard is defined as being a function of the laser wavelength, flux (in $W/cm^2$), pulse width, and the apparent angular size (AAS) of the source. It has been further recognized by the present inventors that for a given wavelength, pulse width, and total power, the hazard may be decreased by decreasing flux and by increasing the AAS. Accordingly, various embodiments of the present invention increase the area occupied by the high-flux light beam 106, increase the uniformity of the high-flux light beam 106 to avoid "hot spots," and diffuse or otherwise attenuate specular reflections that might otherwise emanate from the laser-based receiver 108.

As shown in FIG. 1, the high-flux light beam 106, strikes the receiver optics and control module 110 of the laser-based receiver 108 at or near normal. The illustration of the normal or near normal condition is presented for ease of understating the illustrations. In other cases, the high-flux light beam 106 may strike the receiver optics and control module 110 of the laser-based receiver 108 at some other angle, including a very low angle of incidence and a very high angle of incidence. Accordingly, in many cases, the laser-based transmitter 102 and the laser-based receiver 108 are in line of sight of each other in a non-normal orientation. Light from the high-flux light beam 106 that is not captured in the receiver optics and control module 110 will be reflected back into free space.

Figure 2:
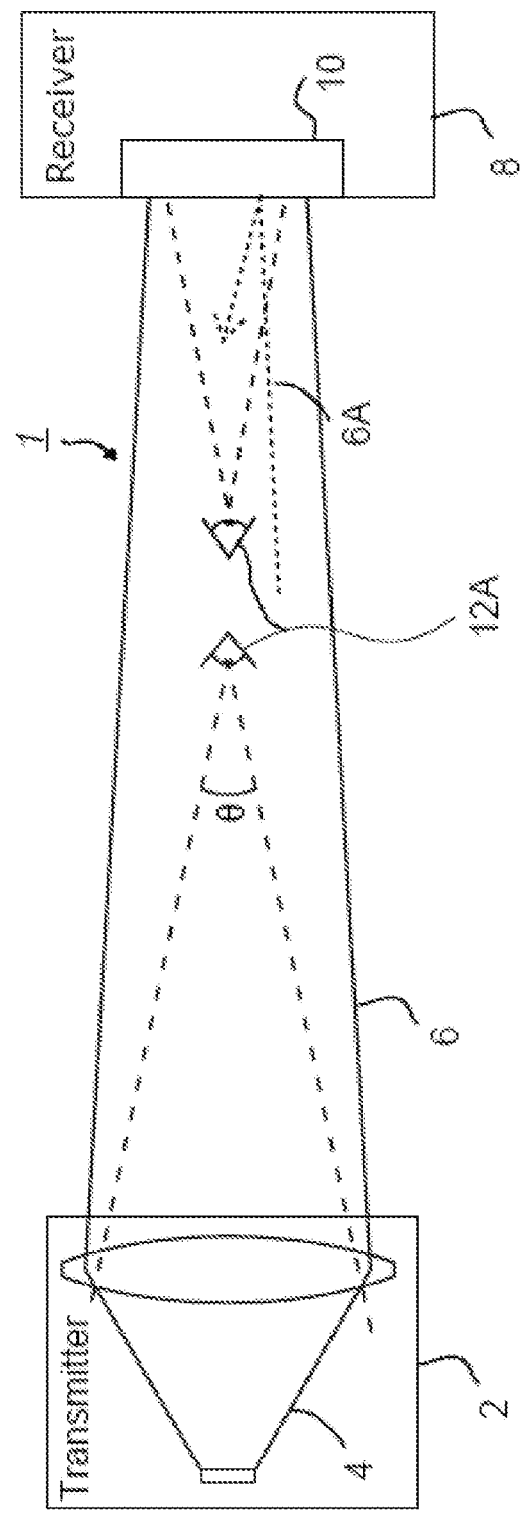
FIG. 2 is a conventional power beam system.

FIG. 2 is a conventional power beam system 1. A conventional transmitter 2 generates a laser light, which is passed through transmitter optics 4, to form a high power beam 6. The high power beam 6 strikes a conventional receiver 8 wherein a set of receiver optics 10 convert the laser light to electricity.

In FIG. 2, a person, represented by the eye 12A of a human being, is in proximity to the high power beam 6. In one aspect, the eye 12A is facing the conventional transmitter 2. A portion of the high power beam 6 from the conventional transmitter 2 strikes the eye 12A, which could cause damage to the eye 12A. In another aspect, the eye 12A is facing a conventional receiver 8. A portion of the high power beam 6 is reflected back from the receiver optics 10 as specularly reflected high power light 6A. The specularly reflected high power light 6A strikes the eye 12A, which could also cause damage.

Figure 3A:
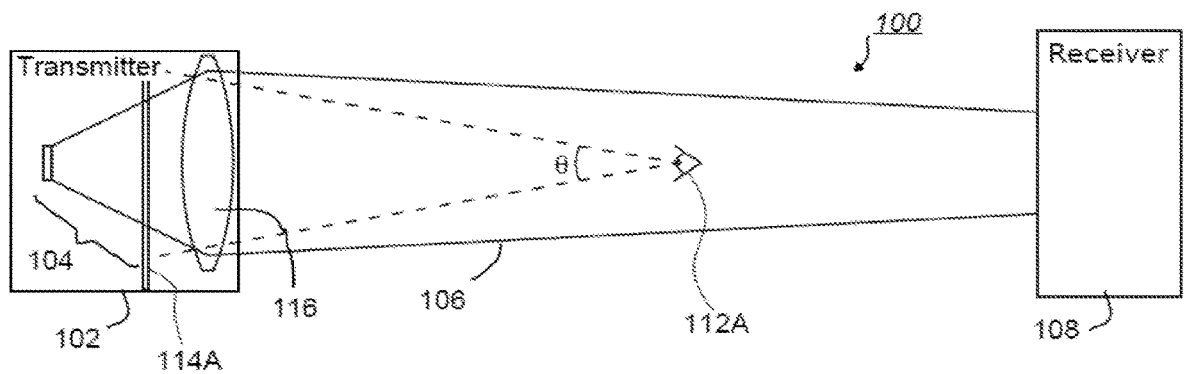
FIGS. 3A-3B illustrate portions of a power beaming system having one or more diffusion elements that increase efficiency and provide improved safety.
Figure 3B:
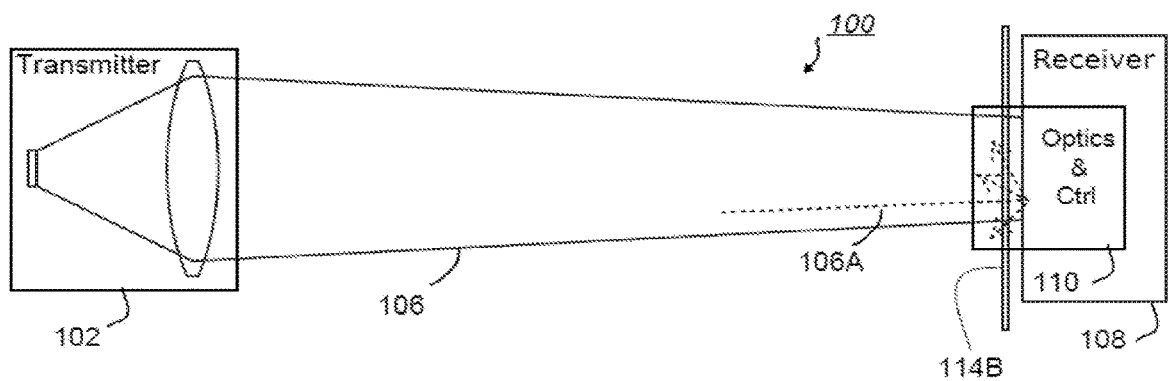

FIGS. 3A and 3B illustrate portions of a power beaming system 100 having one or more diffusion elements that increase efficiency and provide improved safety. In the figures, a laser-based transmitter 102, which includes a transmitter optics and control module 104, converts electric power into optical power. Illustrated in FIG. 3A, the transmitter optics and control module 104 includes a first diffusion element 114A and a projection element 116. The transmitter optics and control module passes and forms the laser light into the high-flux light beam 106. Illustrated in FIG. 3B, the high-flux light beam 106 reaches the laser-based receiver 108 via the receiver optics and control module 110.

In the embodiment of FIG. 3A, a laser-based transmitter 102 has some combination of one or more beam-shaping elements, beam-homogenizing elements, and diffusing elements arranged in an optical train such that the laser-based transmitter 102 efficiently illuminates the laser-based receiver 108, which also has a predetermined shape. Due to the more efficient illumination, the laser eye exposure hazard in the space between the laser-based transmitter 102 and the laser-based receiver 108 is reduced.

As discussed herein, eye exposure hazard from a laser source is defined by various U.S. and international standards such as ANSI Z136.1. The ANSI definition is a function of the laser wavelength, flux (in $W/cm^2$), pulse width, and the apparent angular size (AAS) of the laser-based light source. The ANSI standard also identifies a safe threshold (in $watts/cm^2$) of light at a point source that is lower than the threshold for an extended source. By providing a particular diffusing element, such as first diffusion element 114A, the laser light may be controllably distributed across a selected area of the projection element 116, such as the entire surface for example, during formation of the high-flux light beam 106.

A laser source (e.g., a laser diode, a gas laser, a fiber laser, and the like) generally approximates a point source of light with a particular divergence. The particular divergence is often different in vertical and horizontal directions. The laser source often has a centrally-peaked or otherwise non-uniform distribution of light. For example, a simple projection of such a laser generally yields a circular or elliptical spot. If observed from within the beam (i.e., standing directly in front of the laser-based transmitter 102), the source may appear to have a very small angular size.

Various beam shaping optics, such as anamorphic prisms and cylindrical lenses for example, are used to make a circular spot from an elliptically-divergent source. Various non-spherical lenses are used to make a symmetrical circular, square, rectangular, hexagonal or otherwise uniform beam from a centrally-peaked or otherwise non-uniform beam. Without any additional beam-forming or beam-shaping actions performed on the laser light, however, these beam modifications do not increase the AAS of the source when used in a laser transmitter.

A diffuser, which bears a surface that is configured to scatter collimated light incident on a point or a small area of the diffuser into a specified angular distribution, is used increase the AAS of a light source. In some cases the selected diffuser may be arranged to produce a specific angular distribution of light such as a uniform square, circular, or another shape angular distribution. Such diffusing elements are generally made with great care to sharpen the defined beam edges as much as possible. Less expensive diffusers, which generally produce Gaussian or similarly smooth angular distributions of light, may also be used.

A beam homogenizer, such as an internally-reflective tube or an array of microlenses, may also be used to create a uniform beam of a particular shape (e.g., circular, square, rectangular, hexagonal, and the like) at the exit plane of the homogenizer. A high-flux light beam from such a beam homogenizer can be projected via lenses, mirrors, or other optical structures to produce a correspondingly uniform focal spot some distance from the homogenizer. If only a homogenizer is used to shape the light beam, however, the high-flux light beam will still appear to originate from a very small focal spot. Stated differently, simply using a homogenizer to shape a light beam does not provide a sufficient increase in the AAS to change the appearance of the light source from a beam having a point source to a beam having uniform intensity.

In some embodiments herein, a beam homogenizer or beam-shaping element is combined with a diffusion element 114A, as shown in FIG. 3A. A projection lens 116, which may have the properties of a condenser lens, is used to direct light from the diffusion element 116 so that central rays from each point on the diffusion element 114A intersect at or near the center of the projection lens 116.

In some embodiments, a relay optic may be used to reduce the intensity of the high-flux beam on the diffusion element 114 A. In these embodiments, the relay optic is implemented because during power transmission, the beam flux at the exit of a homogenizer in particular may substantially exceed the rated flux for many types of diffusion elements 114A, which are only a few W/cm² in some embodiments. In these cases, the relay optic may enlarge the beam by 1.5×, 2×, 3× or a larger factor, while reducing the beam angular divergence by an equal factor. The reduced divergence may also provide a benefit of a simplified design of the projection optics.

In some embodiments, the relay optic may be followed by a field lens close to or integrated with, the diffusion element 114A.

In some embodiments, the projection element 116 may be a zoom lens or varifocal lens. In these cases, the size of a projected laser spot can be matched to the size of a power receiving component (e.g., a photovoltaic array) over a range of receiver sizes and transmitter-to-receiver distances.

In some embodiments, the angular distribution of light produced by the diffuser may be selectable. The selection may be made manually or automatically under the direction of the control and optics module 104. The control and optics module 104 may automatically, or under the control of a user, select one of several diffusion elements 114A, such that an aperture of the projection element 116 is approximately filled by the beam. That is, the particular properties, positioning, and other characteristics of the diffusion element 114A are chosen to produce a high power beam having an AAS that substantially comports with the size and shape of the projection element 116 for a range of projection lens focal lengths.

In some embodiments, one or more of the beam width, beam height, or other light distribution properties at an aperture of the projection element 116 are matched to a selected aperture size by varying the position of the diffusion element 114A within the optical path. In some embodiments, one or more of the beam width, beam height, or other light distribution properties at an aperture of the projection element 116 are matched to the aperture size by varying other elements or parameters of the optical train. One example of such varying includes varying the divergence of a laser beam entering an internally-reflective homogenizer.

In some embodiments, multiple parallel or substantially parallel optical paths are generated and passed between a laser-based transmitter 102 and a laser-based receiver 108. Such arrangements are formed in order to manage a high amount of available laser power per laser source, or to increase power handling capability of the homogenizer. Such arrangements may also be formed to match a particular geometry of the projection element 116 or some other structure of the transmitter optics and control module 104. These embodiments may be configured with projection optics, field lenses, or other such structures placed slightly off-axis to provide beam convergence on the laser-based receiver 108.

In some embodiments, projection lenses may be closely packed and in other embodiments, projection lenses may be spaced apart to further increase the effective AAS. By spacing projection lenses further apart, each beam can be treated as a separate hazard source bearing only a fraction of the total transmitter power. Such distance spacing of projection lenses may also provide for easier fabrication, assembly, or alignment.

Considering FIG. 3B, the laser-based receiver 108 exposes a sufficiently flat surface to the high-flux light beam 106 as to cause specular reflections of at least some portions of the high-flux light beam 106. In some embodiments, a diffusion element 114B is laminated or otherwise attached at or near the surface of a laser-power-receiver photovoltaic array, which is integrated as part of the receiver optics and control module 110. As shown in FIG. 3B, the diffusion element 114B will diffuse any specularly reflected light 106A, including light reflected from the diffuser itself, light reflected from the underlying photovoltaic cells, light reflected off protective cover glasses, and the like, thereby causing the reflected intensity to fall off rapidly with distance from the receiving array. This diffusion allows safe operation of a laser power receiver with a much smaller "keep-out zone" radius for eye hazard, skin hazard, or other hazard than would be required for potential exposure to specular or near-specular reflections.

Figure 4A:
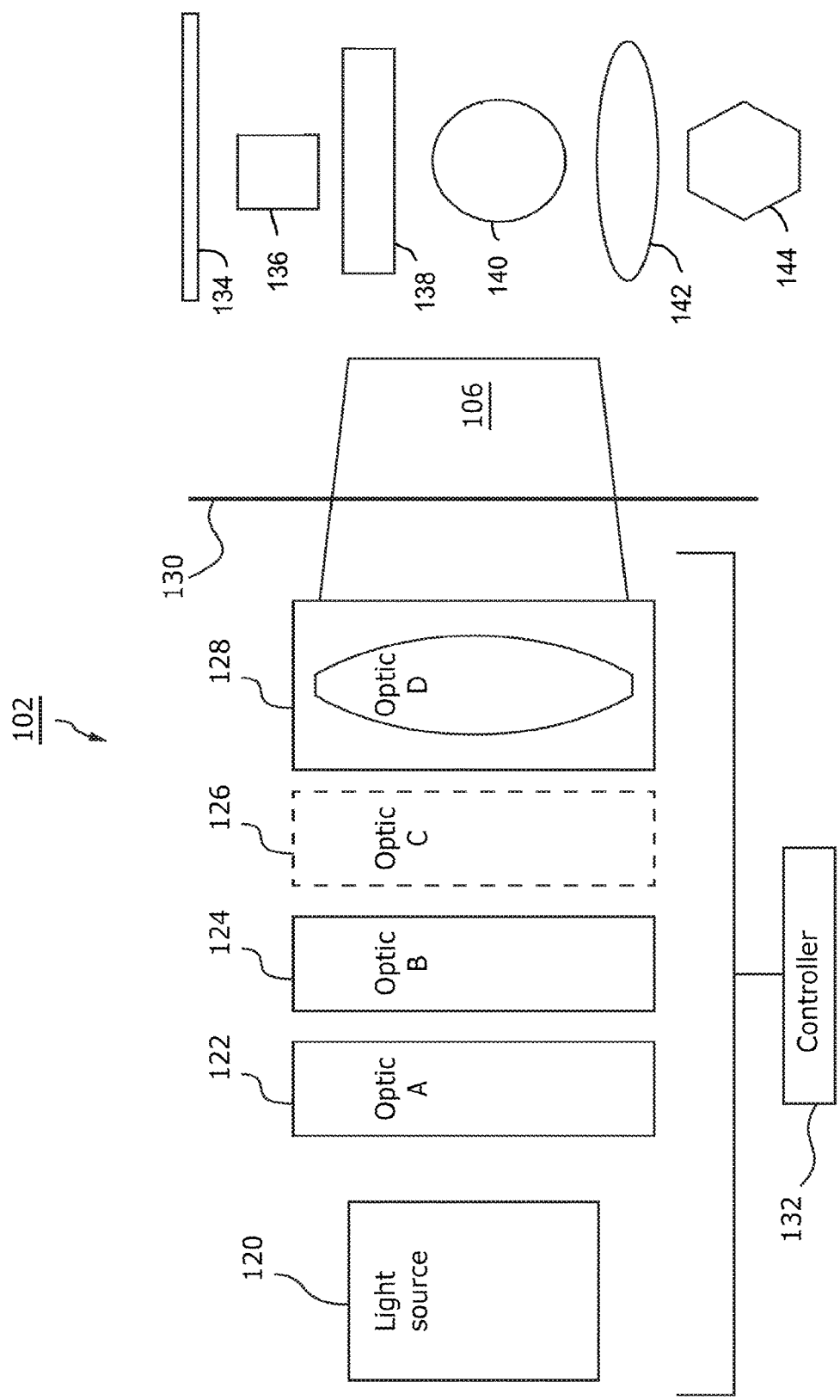
FIG. 4A is a laser-based transmitter embodiment.

FIG. 4A is a laser-based transmitter embodiment 102. In the embodiment, various elements of the transmitter optics and control module 104 (FIG. 1) are shown in more detail. A light source 120 generates a laser-based light. An assembly of one or more optical elements are positioned between the light source 120 and a particular housing 130 or other structure having an aperture through which a high-flux light beam 106 passes. The assembly of one or more optical elements includes an OPTIC_A first element 122, an OPTIC_B second element 124, an OPTIC_C third element 126, and an OPTIC_D fourth element 128. A transmitter control module 132 controls operations of the laser-based transmitter 102, including the assembly of one or more optical elements. The transmitter control module 132 may be used to direct the laser-based transmitter 102 to produce a high-flux light beam 106 having a particular cross-sectional pattern. In FIG. 4A, the high-flux light beam 106 may be formed having a line beam pattern 134, a square beam pattern hundred 136, a rectangular beam pattern 138, a circular beam pattern 140, an elliptical beam pattern 142, a hexagonal pattern 144, or some other pattern.

In at least one case, the OPTIC_A first element 122 is arranged as a beam homogenizer or beam-shaping optical element that generally gathers and directs the high-flux light from light source 120 toward the output aperture in the housing 130. The OPTIC_B second element 124 and the OPTIC_C third element 126 may be arranged as one or more of a diffusion element (e.g., diffusion element 114 in FIG. 3A), a condensing lens element, a relay optic element, a field lens element, or some other optical element. The OPTIC_D fourth element is arranged as a projection element (e.g., projection element 116 in FIG. 3A). Embodiments described herein with respect to the optical elements in FIG. 4A represent only a subset of the particular layers and configurations of optical elements contemplated by the inventors. More, fewer, and different optical elements are contemplated.

Various embodiments are now described in view of the laser-based transmitter 102 and laser-based receiver 108 along with the structures thereof illustrated in FIGS. 1, 3A, 3B, 4A, and 4B.

A power beaming system generates a laser light beam for transmission from a first location toward a second location. The first and second locations are remote from each other. The laser light beam is transmitted so that light received at the second location may be converted to useful electricity.

In this power beaming system, the laser light beam is generated from a power beam transmission source such as light source 120. The power beam transmission source may be a laser source that generates a raw light output with one or more laser diodes, gas lasers, fiber lasers, super-radiant diodes, another type of light emitting diode (LED), or some other high-intensity light source. In these cases, the laser source and generally produces light having a determined divergence, which may include divergence in a vertical direction, a horizontal direction, both vertical and horizontal directions, and with different divergences in different directions. In some cases, the power beam transmission source includes a plurality of power beam transmission sources. In these cases, light from the plurality is prepared individually or in combination to provide a plurality of parallel or substantially parallel laser light beams.

The light output of the power beam transmission source passes through various optical elements (e.g., optical fibers, lenses, mirrors, and the like) which convert the raw laser light to a beam of a desired size, shape, power distribution, and divergence. Various elements of the laser assembly also aim the light beam toward the receiver. For example, in the embodiment now described, the OPTIC_A first element 122 of FIG. 4A is a beam-shaping element to shape the laser light beam. For example, in some cases, the beam-shaping element includes at least one anamorphic prism or at least one cylindrical lens. In other cases, the beam-shaping element includes at least one non-spherical lens arranged to form a uniform circular beam, square beam, or rectangular beam from a non-uniform beam.

In embodiments of the present invention, light from the beam-shaping element passes through a diffusion element. In some cases, the OPTIC_B second element 124 is arranged as a diffusion element. In other cases, for example when a relay optic element is employed, the optional OPTIC_C third element 126 is arranged as the diffusion element. The diffusion element in FIG. 4A generally corresponds to diffusion element 114 of FIG. 3A. In some cases, for example when the OPTIC_B second element 124 is arranged as a diffusion element, the OPTIC_C third element 126 is arranged as a condenser lens element positioned to direct central rays of light from the diffusion element toward a central portion of the projection element (e.g., the OPTIC_D fourth element 128).

As described herein, the high-flux light beam 106 may pose a risk to humans, animals, or other biological structures by damaging eyes, skin, or other matter. Accordingly, the diffusion element is provided to uniformly distribute light of the shaped laser light beam and thereby reduce apparent points of focused flux (i.e., "hot spots"). Along these lines, the diffusion element may be arranged to increase an apparent angular size (AAS) of the shaped laser light beam or to additionally or alternatively produce a geometrically symmetric distribution of the shaped laser light beam. The diffusion element of the embodiments described herein may be formed from an internally-reflective tube, an arrangement of micro lenses, and ground glass lens, or from some other structure.

In the present embodiments, the projection element is arranged to illuminate a power beam receiving element at a remote location with the shaped laser light beam. The power beam receiving element has a predetermined shape. Desirably, the high-flux light beam 106 transmitted from the laser-based transmitter 102 will have a corresponding predetermined shape.

In some cases, the projection element is arranged as a zoom lens, a varifocal lens, or some other type of optical lens structure. In this way the projection element is selectably positionable to match the shaped laser light beam to a size and shape of the power beaming receiving element over a range of power beaming receiving element sizes and distances. The projection element may be manually selectable, electromechanically selectable, automatically selectable, programmatically selectable, or adjusted in some other way. In some embodiments, the laser-based transmitter 102 includes a transmitter control module 132, which enables the selectable positioning of the projection element in a desirable way.

In at least some embodiments described herein, the diffusion element and the projection element work cooperatively to reduce hotspots and to efficiently transfer a high amount of power in the high-flux light beam 106. For example, the diffusion element may be arranged to receive and uniformly distribute input light across a selected area (e.g., the entire projection element or a selected shape to match a receiving element) of the projection element. In some of these cases the angular distribution of light from the diffusion element may be manually selectable or automatically selectable to substantially fill a projection element aperture for a range of projection element focal lengths. In these or other cases, a position of the diffusion element is varied in order to match a beam width and a light distribution of the shaped laser light to the projection element aperture. The projection element may also work cooperatively with other optical elements in some embodiments such as the beam-shaping elements. For example, a beam width and a light distribution of the shaped laser light may be matched to a projection element aperture by varying divergence of the shaped laser light entering an internally-reflective homogenizer.

The projection element may be embodied in one or more individual projection elements. For example, in some embodiments the projection element includes a plurality of projection elements positioned slightly off-axis relative to each other. In some embodiments, the projection element or any in a plurality of projection elements may be positioned off-axis relative to the light source. In these cases, respective light beams passed from each of the plurality of projection elements are arranged to converge on the power beam receiving element at the remote location. The plurality of projection elements may include one or more field lenses, which may be positioned between an optical relay element and a diffusion element, or which may be integrated with a diffusion element, or which may be arranged in some other way. In these and other cases, a plurality of projection lenses are closely packed and aligned to increase an effective apparent angular size (AAS); and in other cases, to improve manufacturability for example, a plurality of projection lenses are spaced apart. In these cases, however, the projection lenses are also aligned to increase the AAS.

In some embodiments, an optical relay is used to improve assembly, configurability, or other operations of the power beaming system. In some cases for example, an optical relay element is positioned to reduce an intensity of light reaching the diffusion element. In other cases an optical relay element is positioned to enlarge a beam of light and correspondingly reduce the angular divergence of the beam of light. The factor of enlargement of the beam of light and corresponding reduction of angular divergence may be 25%, 50%, 100%, 300%, or some other factor.

Figure 4B:
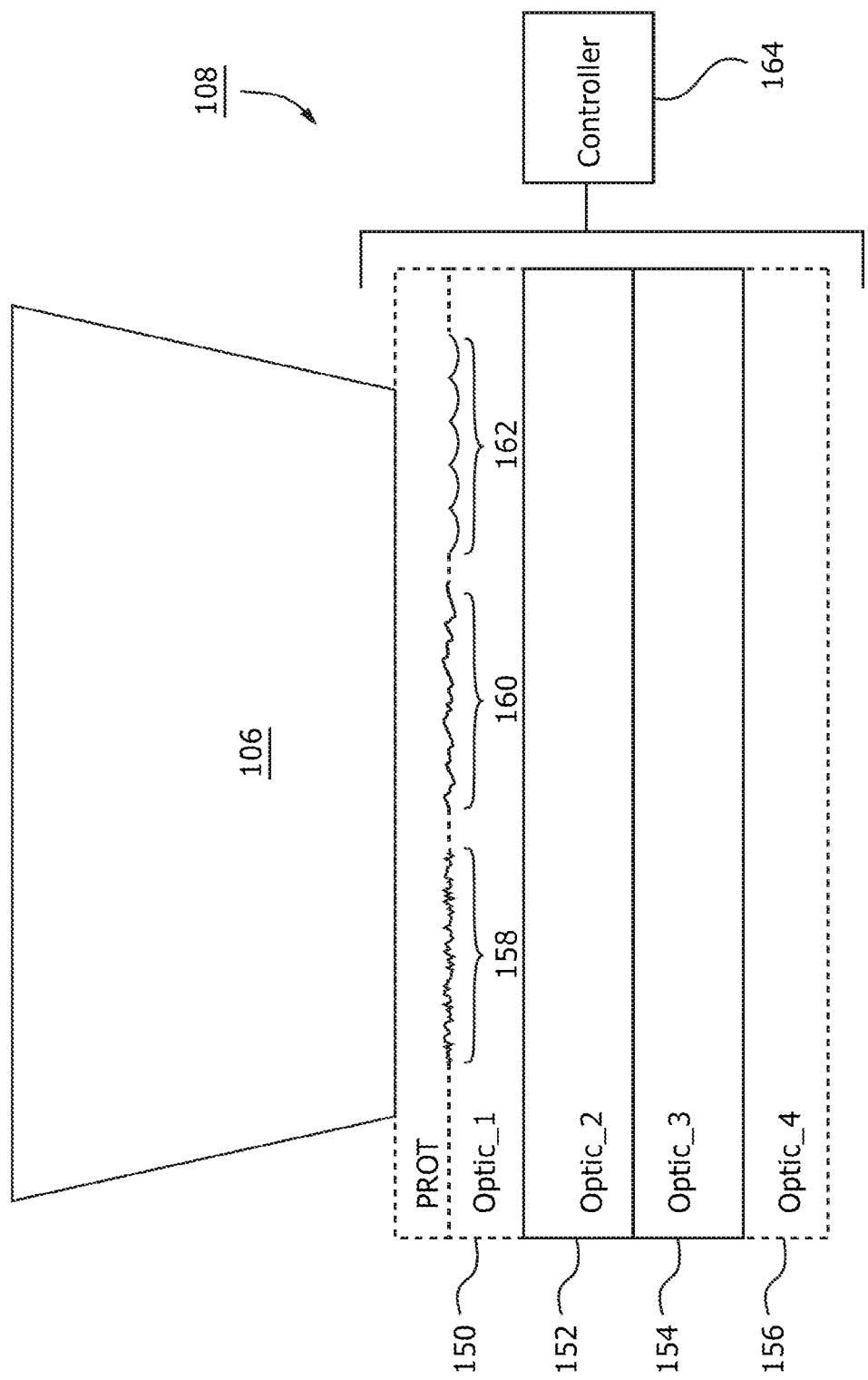
FIG. 4B is a laser-based receiver embodiment.

FIG. 4B is a laser-based receiver embodiment 108. In the embodiment, one or more elements of the receiver optics and control module 110 (FIG. 1) are shown in more detail. A high-flux light beam 106 is received at an OPTIC_1 first element 150 of the laser-based receiver embodiment 108. Portions of the high-flux light beam 106 passed through an OPTIC_2 second element 152, an OPTIC_3 third element 154, and an OPTIC_4 fourth element 156. One or more other features of at least one optical layer may also be configured within the receiver optics and control module 108.

For example, a diffusion feature 158 is shown along with a plurality of diffractive optical elements (DOE's) 160, and a micro lens array 162. In some embodiments, only one of the features is formed, and in other embodiments, two or more of a diffusion feature 158, a DOE 160 feature, and a micro lens array 162 feature are formed. The particular features are illustrated in the OPTIC_1 first element 150, but such features may also be formed or otherwise positioned in any other optical layer. In addition, one optical layer may be formed to have one feature (e.g., a diffusion feature 158, a DOE 160 feature, and a micro lens array 162 feature), and other optical layer may be formed to have another feature (e.g., a diffusion feature 158, a DOE 160 feature, and a micro lens array 162 feature). In some cases, two or more optical layers have a same kind of features, and in some cases, two or more optical layers have different features. In addition, the optical features illustrated in the OPTIC_1 first element 150 of the laser-based receiver embodiment 108 of FIG. 4B (i.e., a diffusion feature 158, a DOE 160 feature, and a micro lens array 162 feature) are exemplary and not exhaustive. Other features, such as concentrators for focusing light toward lower optical layers, mirrored surfaces for re-directed certain reflected light, and other features are also contemplated.

Operations of the laser-based receiver 108 are controlled or otherwise directed by a receiver control module 164.

In at least one case, the OPTIC_1 first element 150 is a protective layer such as a glass, plastic, film, epoxy, polyester resin, or some other material arranged to protect the underlying optical train from physical damage due to rain, hail, malicious activity, bird strikes, or other such impacts. When so arranged as a protective layer, the OPTIC_1 first element 150 may be arranged as a filter tuned to a particular wavelength or wavelength range and thereby generally transparent to the high-flux light beam 106. The OPTIC_2 second element 152 may be formed as a diffusion element, a focusing element, a lens, an array of lenses, or a different structure. The OPTIC_3 third element 154 may be formed as a power conversion layer such as an array of photovoltaic cells, and the OPTIC_4 fourth element 156 may be a substrate (e.g., a structural substrate, a thermal substrate, a combination structural and thermal substrate, or some other type of substrate) for one or more of the other optical elements. For example, the OPTIC_4 fourth element may be a glass substrate for the array of photovoltaic cells. The embodiments described herein with respect to the optical elements describe only a subset of the particular layers, and other configurations of the optical elements, including more or fewer optical elements, are contemplated.

Various embodiments are now described in view of the laser-based transmitter 102 and laser-based receiver 108 along with the structures thereof illustrated in FIGS. 1, 3A, 3B, 4A, and 4B.

As discussed herein, in some embodiments, a diffusion element 114B is deposited on or otherwise formed adjacent to a photovoltaic array. In other embodiments, however, the diffusion element 114B is not directly deposited on the photovoltaic cells. In these cases, the diffusion element 114B positioned at or near a back surface of a transparent, protective cover sheet. In these cases, the protective cover sheet is between a photovoltaic array and the laser-based transmitter 102, which may be a surface farthest from the laser source and closest to the photovoltaic cells. The transparent, protective cover sheet may have a front surface bearing an antireflective coating optimized for the power laser wavelength. In these embodiments, specular reflection from the cover sheet is reduced while protecting the diffusion element 114B from contamination or physical damage. In some cases, the cover sheet is curved or shaped. In these or still other cases, the cover sheet may be formed with a corrugated arrangement, a quilted pattern, or some other feature to further disperse residual specular reflections.

In these cases, because the photovoltaic cells are only weakly sensitive to the incidence angle of the high-flux light beam 106, the presence of a non-absorbing and non-reflecting diffusion element 114B will not greatly affect the efficiency of the laser-based receiver 108. Furthermore, since some embodiments of photovoltaic cells may tend to reflect light incident at near-grazing angles, the diffusion element 114B is preferably not a Lambertian (2-pi) scatterer, and instead has a narrower scattering distribution. In various embodiments described herein, the diffusion element 114B is a holographic diffuser, a roughened surface diffuser, a diffuser composed of small particles or lenslets, or another type of diffusion element 114B.

The diffusion element 114B may be formed as a transmitting diffuser. In some embodiments, the diffusion element 114B is ground into the surface (e.g., by sand-blasting) of a particular substrate such as class. Alternatively, in some embodiments, a diffusion element 114B is formed as a plurality of diffractive optical elements (DOE's), a plurality of micro-lens arrays (MLA's), or in some other arrangement. DOE's can be etched or otherwise abraded directly into a material such as glass, however, in some cases a master template is used to imprint a selected pattern, which may be a random pattern, into thin sheets of polymers, which are then applied to glass substrates.

Figure 5A:
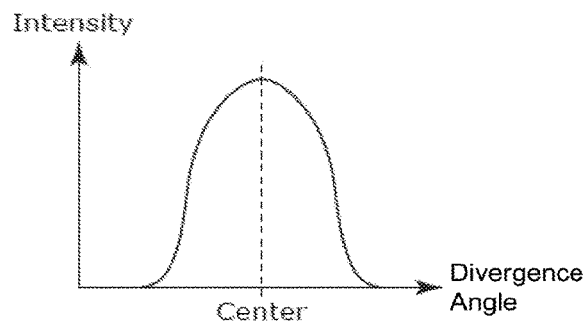
FIGS. 5A-5D are intensity profiles produced by embodiments of different diffusion elements.
Figure 5B:
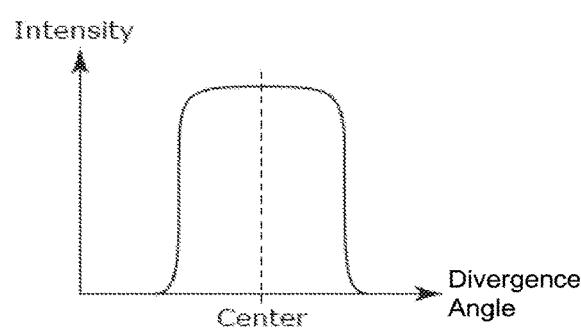
Figure 5C:
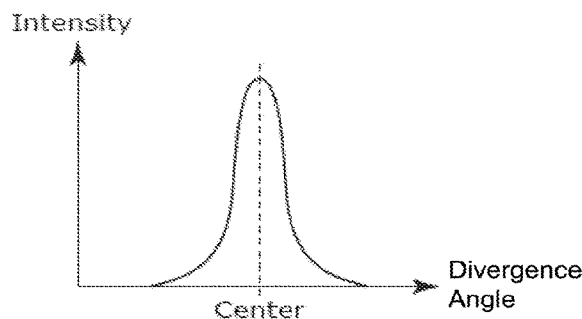
Figure 5D:
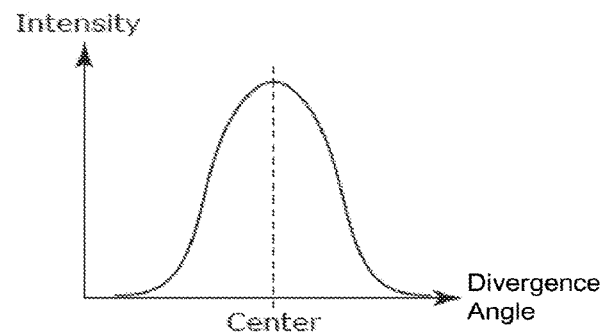

The examples presented in FIGS. 5A-5D each highlight different ways in which diffusers spread out a beam across a wider divergence angle than the incident beam. In these examples, the incident beam striking the diffusion element is collimated thereby having effectively zero divergence, centered on the "Center" line in each figure. In FIGS. 5A and 5B, the tails of the distribution fall off very quickly, so that the full width at half maximum (FWHM) encompasses a large fraction of the total power of each beam. In contrast, FIGS. 5C and 5D have longer tails, with the result that more of the power in each beam is outside the FWHM. As another example, FIG. 5B has a much flatter distribution than the distribution in FIGS. 5A, 5C, and 5D, as might be the case for an engineered diffuser that creates a round, flat top output profile. In many cases, diffusers are specified by the angle to which light is diffused, with that angle being measured as FWHM or another like value. As yet another example, FIG. 5C illustrates a much narrower angle than FIGS. 5A, 5B, and 5D.

While any portion of the high-flux light beam reflected back from the surface of a laser-based receiver may be undesirable, lowering the intensity of light that is reflected away from the central axis of the high-flux light beam is generally desirable. In these cases, wherein the intensity of light reflected away from the high-flux light beam central access is lowered, the eye, skin, or other biological tissue of human beings or animals may be "safe" in an area closer to the high-flux light beam.

A power beaming system that generates a laser light beam for transmission from a first location toward a second location is again considered. The first and second locations are remote from each other, and the transmitted laser light is received at the second location where it may be converted to useful electricity. In order to improve safety, portions of the power beam that are not converted to electricity are instead diffused in order to protect human beings, animals, or other objects.

In embodiments of the system to diffuse a power beam, a power beam transmitter is arranged to transmit a power beam, and a power beam receiver is arranged to receive the power beam from the power beam transmitter. A diffusion surface is arranged to diffuse a portion of the power beam that is specularly reflected from the power beam receiver. Embodiments of the particular system include at least one photovoltaic arrangement having at least one surface positioned substantially normal to the power beam. In these cases, the diffusion surface is positioned in proximity to the particular photovoltaic arrangement. In this type of arrangement, a large amount of the high-flux light beam is captured by the photovoltaic arrangement, and any portion of the high-flux light beam not so captured (e.g., light that strikes a structural, non-converting portion of the photovoltaic arrangement) is preferably diffused.

In some cases, the diffusion surface includes a diffuser attached directly or indirectly at the surface of the particular photovoltaic arrangement. For example, the diffusion surface may in some cases be directly deposited on the particular photovoltaic arrangement. Alternatively, or in addition, a diffusion surface may be positioned on a back surface of a transparent covering. In this way, the diffusion surface is arranged to diffuse specularly reflected light from one or more of the diffusion surface itself, the particular photovoltaic arrangement, the protective material positioned above the particular photovoltaic arrangement, or some other source, while the diffuser surface is protected from the environment.

The transparent covering may be positioned above the particular photovoltaic arrangement to offer protection from environmental elements, malicious attacks, or any other object that would otherwise strike the particular photovoltaic arrangement. In some cases, the transparent covering has a front surface bearing an antireflective coating. The antireflective coating may be selected based on a wavelength of the high-flux power beam. In these cases, or in other cases, the transparent covering has a particular diffusion feature integrated therein.

The diffusion surfaces in the present embodiments may be formed in any of the ways described herein. For example, the diffusion surface may include a plurality of lenslets. The plurality of lenslets operate to focus light toward the particular photovoltaic arrangement. The light focused to the particular photovoltaic array may be light from the high-flux light beam, reflected portions of the high-flux light beam, or any other light. In some cases, the diffusion surface may include one or more diffractive optical elements (DOE's). The DOE's may be etched directly into glass, formed as at least one sheet of polymers applied to a glass substrate, or prepared and arranged in a different way. In these or in still different cases, the diffusion surface may include one or more micro-lens arrays (MLA's).

Certain words and phrases used in the present disclosure are set forth as follows. The terms "include" and "comprise," as well as derivatives thereof, mean inclusion without limitation. The term "or," is inclusive, meaning and/or. The phrases "associated with" and "associated therewith," as well as derivatives thereof in all grammatical forms, may mean to include, be included within, interconnect with, contain, be contained within, connect to or with, couple to or with, be communicable with, cooperate with, interleave, juxtapose, be proximate to, be bound to or with, have, have a property of, or the like. The term "controller" means any device, system, or part thereof that controls at least one operation, such a device may be implemented in hardware, firmware, or software, or some combination of at least two of the same. The functionality associated with any particular controller may be centralized or distributed, whether locally or remotely. Other definitions of certain words and phrases may be provided within this patent document. Those of ordinary skill in the art will understand that in many, if not most instances, such definitions apply to prior as well as future uses of such defined words and phrases.

Where one or more figures included in the present disclosure illustrates a data flow diagram, the illustrated process is a non-limiting process that may be used by embodiments of high-flux power beam or field systems. In this regard, each described process may represent a module, segment, or portion of software code, which comprises one or more executable instructions for implementing the specified logical function(s). It should also be noted that in some implementations, the functions noted in the process may occur in a different order, may include additional functions, may occur concurrently, and/or may be omitted.

In some cases, the figures in the present disclosure illustrate portions of one or more non-limiting computing device embodiments such as the transmitter control module 132 and the receiver control module 164. The computing devices may include operative hardware found in conventional computing device apparatuses such as one or more processors, volatile and non-volatile memory, serial and parallel input/output (I/O) circuitry compliant with various standards and protocols, wired and/or wireless networking circuitry (e.g., a communications transceiver), one or more user interface (UI) modules, logic, and other electronic circuitry. In addition, or in the alternative, the computing device embodiments may be electronic circuits formed to carry out operations of a finite state machine.

Processors, such as those that may be employed in the transmitter control module 132 and the receiver control module 164, may include central processing units (CPU's), microcontrollers (MCU), digital signal processors (DSP), application specific integrated circuits (ASIC), and the like. The processors interchangeably refer to any type of electronic control circuitry configured to execute programmed software instructions. The programmed instructions may be high-level software instructions, compiled software instructions, assembly-language software instructions, object code, binary code, micro-code, or the like. The programmed instructions may reside in internal or external memory or may be hard-coded as a state machine or set of control signals. According to methods and devices referenced herein, embodiments describe software executable by the processor and operable to execute certain ones of the method acts.

As known by one skilled in the art, a computing device has one or more memories such as memory 126, and each memory comprises any combination of volatile and non-volatile computer-readable media for reading and writing. Volatile computer-readable media includes, for example, random access memory (RAM). Non-volatile computer-readable media includes, for example, read only memory (ROM), magnetic media such as a hard-disk, an optical disk drive, a floppy diskette, a flash memory device, a CD-ROM, and/or the like. In some cases, a particular memory is separated virtually or physically into separate areas, such as a first memory, a second memory, a third memory, etc. In these cases, it is understood that the different divisions of memory may be in different devices or embodied in a single memory. The memory in some cases is a non-transitory computer medium configured to store software instructions arranged to be executed by a processor.

The computing devices illustrated herein may further include operative software found in a conventional computing device such as an operating system or task loop, software drivers to direct operations through I/O circuitry, networking circuitry, and other peripheral component circuitry. In addition, the computing devices may include operative application software such as network software for communicating with other computing devices, database software for building and maintaining databases, and task management software where appropriate for distributing the communication and/or operational workload amongst various processors. In some cases, the computing device is a single hardware machine having at least some of the hardware and software listed herein, and in other cases, the computing device is a networked collection of hardware and software machines working together in a server farm to execute the functions of one or more embodiments described herein. Some aspects of the conventional hardware and software of the computing device are not shown in the figures for simplicity.

When so arranged as described herein, each computing device may be transformed from a generic and unspecific computing device to a combination device comprising hardware and software configured for a specific and particular purpose.

Database structures, if any are present in the power beaming system embodiment 100 or in other embodiments, may be formed in a single database or multiple databases. In some cases hardware or software storage repositories are shared amongst various functions of the particular system or systems to which they are associated. A database may be formed as part of a local system or local area network. Alternatively, or in addition, a database may be formed remotely, such as within a "cloud" computing system, which would be accessible via a wide area network or some other network.

Input/output (I/O) circuitry and user interface (UI) modules include serial ports, parallel ports, universal serial bus (USB) ports, IEEE 802.11 transceivers and other transceivers compliant with protocols administered by one or more standard-setting bodies, displays, projectors, printers, keyboards, computer mice, microphones, micro-electro-mechanical (MEMS) devices such as accelerometers, and the like.

Buttons, keypads, computer mice, memory cards, serial ports, bio-sensor readers, touch screens, and the like may individually or in cooperation be useful to an operator of the power beaming system embodiment 100. The devices may, for example, input control information into the system. Displays, printers, memory cards, LED indicators, temperature sensors, audio devices (e.g., speakers, piezo device, etc.), vibrators, and the like are all useful to present output information to the operator of the power beaming system embodiment 100. In some cases, the input and output devices are directly coupled or otherwise electronically coupled to a processor or other operative circuitry. In other cases, the input and output devices pass information via one or more communication ports (e.g., RS-232, RS-485, infrared, USB, etc.)

Where a range of values is provided, it is understood that each intervening value, to the tenth of the unit of the lower limit unless the context clearly dictates otherwise, between the upper and lower limit of that range and any other stated or intervening value in that stated range is encompassed within the invention. The upper and lower limits of these smaller ranges may independently be included in the smaller ranges is also encompassed within the invention, subject to any specifically excluded limit in the stated range. Where the stated range includes one or both of the limits, ranges excluding either or both of those included limits are also included in the invention.

Unless defined otherwise, the technical and scientific terms used herein have the same meaning as commonly understood by one of ordinary skill in the art to which this invention belongs. Although any methods and materials similar or equivalent to those described herein can also be used in the practice or testing of the present invention, a limited number of the exemplary methods and materials are described herein.

As used in the present disclosure, the term "module" refers to an application specific integrated circuit (ASIC), an electronic circuit, a processor and a memory operative to execute one or more software or firmware programs, combinational logic circuitry, or other suitable components (i.e., hardware, software, or hardware and software) that provide the functionality described with respect to the module.

A processor (i.e., a processing unit), as used in the present disclosure, refers to one or more processing units individually, shared, or in a group, having one or more processing cores (e.g., execution units), including central processing units (CPUs), digital signal processors (DSPs), microprocessors, micro controllers, state machines, and the like that execute instructions. In the present disclosure, the terms processor in any of its grammatical forms is synonymous with the term controller.

In the present disclosure, memory may be used in one configuration or another. The memory may be configured to store data. In the alternative or in addition, the memory may be a non-transitory computer readable medium (CRM) wherein the CRM is configured to store instructions executable by a processor. The instructions may be stored individually or as groups of instructions in files. The files may include functions, services, libraries, and the like. The files may include one or more computer programs or may be part of a larger computer program. Alternatively or in addition, each file may include data or other computational support material useful to carry out the computing functions of the systems, methods, and apparatus described in the present disclosure.

The terms, "real-time" or "real time," as used interchangeably herein and in the claims that follow, are not intended to imply instantaneous processing, transmission, reception, or otherwise as the case may be. Instead, the terms, "real-time" and "real time" imply that the activity occurs over an acceptably short period of time (e.g., over a period of microseconds, milliseconds, seconds, minutes or some other time frame as the context of the term's use implies), and that the activity may be performed on an ongoing basis (e.g., stopping the transmission of a high-flux power beam or field). An example of an activity that is not real-time is one that occurs over an extended period of time (e.g., hours, days, weeks, months, years, or some other time frame as the context of the term's use implies) or that occurs based on intervention or direction by a person or other activity.

Unless the context requires otherwise, throughout the specification and claims which follow, the word "comprise" and variations thereof, such as, "comprises" and "comprising" are to be construed in an open, inclusive sense, e.g., "including, but not limited to."

Reference throughout this specification to "one embodiment" or "an embodiment" and variations thereof means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content and context clearly dictates otherwise. It should also be noted that the conjunctive terms, "and" and "or" are generally employed in the broadest sense to include "and/or" unless the content and context clearly dictates inclusivity or exclusivity as the case may be. In addition, the composition of "and" and "or" when recited herein as "and/or" is intended to encompass an embodiment that includes all of the associated items or ideas and one or more other alternative embodiments that include fewer than all of the associated items or ideas.

The headings and Abstract of the Disclosure provided herein are for convenience only and do not limit or interpret the scope or meaning of the embodiments.

The various embodiments described above can be combined to provide further embodiments. Aspects of the embodiments can be modified, if necessary to employ concepts of the various patents, application and publications to provide yet further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method of diffusing a power beam, comprising:
receiving the power beam at a power beam receiver; and
diffusing a specularly-reflected portion of the received power beam with a diffusion surface.

2. A method according to claim 1, wherein the power beam receiver includes:
a photovoltaic arrangement having a surface positioned to receive at least a powering portion of the received power beam,
and wherein receiving the power beam at the power beam receiver includes receiving at least a portion of the power beam at the diffusion surface before receiving the received power beam at the photovoltaic arrangement.

3. A method according to claim 2, wherein the diffusion surface is a diffuser attached proximate to the surface of the photovoltaic arrangement.

4. A method according to claim 2, wherein diffusing a specularly-reflected portion of the received power beam includes diffusing light specularly reflected from the photovoltaic arrangement.

5. A method according to claim 2, wherein:
receiving the power beam at the power beam receiver includes allowing at least a portion of the power beam to pass through a transparent covering before reaching the photovoltaic arrangement; and
the diffusion surface is a surface of the transparent covering.

6. A method according to claim 5, wherein the transparent covering includes an antireflective coating on a surface distal from the at least one photovoltaic arrangement, the antireflective coating selected based on a wavelength of the power beam.

7. A method according to claim 2, wherein the diffusion surface is a non-optical surface of the power beam receiver.

8. A method according to claim 2, wherein:
the surface positioned to receive at least a powering portion of the received power beam is a surface of a component of the power beam receiver that is first to be struck by the power beam after its travel through free space.

9. A power beaming method, comprising:
generating a power beam for transmission from a transmission location to a receiving location, the receiving location being remote from the transmission location;
diffusing the power beam at the transmission location to produce a diffused power beam; and
projecting the diffused power beam toward the receiving location.

10. A method according to claim 9, wherein generating the power beam includes generating the power beam using at least one light source selected from the group consisting of a diode laser, a gas laser, and a fiber laser, the power beam having a determined divergence.

11. A method according to claim 10, wherein the determined divergence is different in vertical and horizontal directions.

12. A method according to claim 9, wherein diffusing the power beam increases an apparent angular size (AAS) of the power beam.

13. A method according to claim 9, wherein diffusing the power beam includes passing the power beam through a diffusion element.

14. A method according to claim 13, wherein the diffusion element includes an element selected from the group consisting of:
an internally-reflective tube;
a diffractive optical element;
a plurality of diffractive optical elements; and
an arrangement of microlenses.

15. A method according to claim 9, wherein diffusing the power beam produces a geometrically symmetric distribution of the diffused power beam.

16. A method according to claim 9, wherein projecting the power beam includes passing the power beam through a projection lens selected from the group consisting of a zoom lens and a varifocal lens, the projection lens being selectably positionable to match the diffused power beam to a size, shape, and position of a receiving element at the receiving location.

17. A system to diffuse a power beam, comprising:
a power beam transmitter arranged to transmit the power beam; and
a power beam receiver arranged to receive the power beam from the power beam transmitter, the power beam receiver including a diffusion surface arranged to diffuse a portion of the power beam that has been reflected from a portion of the power beam receiver, the diffusion surface being positioned to be a surface of the initial component of the power beam receiver to receive the power beam.

18. A system according to claim 17, wherein the diffusion surface is an outer surface of a transparent covering.

19. A system according to claim 17, wherein the diffusion surface is arranged to diffuse a portion of the power beam that has been reflected from an element selected from the group consisting of:
a photovoltaic cell;
a concentrator;
a mirror;
a lens; and
the diffusion surface.

20. A system according to claim 17, wherein the diffusion surface includes an element selected from the group consisting of:
an internally-reflective tube;
a diffractive optical element;
a plurality of diffractive optical elements;
an arrangement of lenses; and
an arrangement of microlenses.

* * * * *